United States Patent [19]

Piasecki

[11] Patent Number: 4,668,881
[45] Date of Patent: May 26, 1987

[54] SENSE CIRCUIT WITH PRESETTING MEANS

[75] Inventor: Douglas S. Piasecki, Middletown Township, Monmouth County, N.J.

[73] Assignee: RCA Corporation, Somerville, N.J.

[21] Appl. No.: 556,932

[22] Filed: Dec. 1, 1983

[51] Int. Cl.[4] ................. H03K 5/153; H03K 3/033; H03K 3/295; H03K 3/286
[52] U.S. Cl. .............................. 307/530; 307/355; 307/291; 307/273; 330/261
[58] Field of Search ............. 307/272 R, 272 A, 597, 307/603, 608, 530, 355, 279, 291, 299 A; 365/203, 205, 208, 273; 330/261

[56] References Cited

U.S. PATENT DOCUMENTS

| | | | |
|---|---|---|---|
| 3,805,093 | 4/1974 | Hodemaekers | 307/291 X |
| 3,814,953 | 6/1974 | Malaviya | 307/272 A X |
| 4,027,176 | 5/1977 | Heuber et al. | 307/291 X |
| 4,121,120 | 10/1978 | Wetterling | 307/291 X |
| 4,134,033 | 1/1979 | Hoffmann et al. | 307/279 X |
| 4,147,943 | 4/1979 | Peterson | 307/355 |
| 4,214,175 | 7/1980 | Chan | 307/279 X |
| 4,250,412 | 2/1981 | Kung et al. | 307/355 X |
| 4,289,979 | 9/1981 | Muller | 307/272 A |
| 4,291,246 | 9/1981 | Martino, Jr. et al. | 307/279 X |
| 4,309,625 | 1/1982 | Takahashi | 307/291 X |
| 4,417,163 | 11/1983 | Otsuki et al. | 365/203 X |
| 4,430,580 | 2/1984 | Lovelace | 307/279 X |
| 4,443,868 | 4/1984 | Takemae | 365/205 |
| 4,467,449 | 8/1984 | Hayashi | 365/203 X |

Primary Examiner—Stanley D. Miller
Assistant Examiner—David R. Bertelson
Attorney, Agent, or Firm—Henry I. Schanzer; Birgit E. Morris; Stanley C. Corwin

[57] ABSTRACT

A circuit whose output is asymmetrical whereby the circuit makes a transition from a first state to a second state more slowly than from the second state to the first state a preset towards the second state prior to the application of data input signals to the circuit.

8 Claims, 4 Drawing Figures

SENSE CIRCUIT WITH PRESETTING MEANS

The Government has rights in this invention pursuant to Subcontract No. A1ZV-684213-E-507 under Contract No. FO4704-78-C-0021 awarded by the Department of the Air Force.

This invention relates to sense circuits and in particular to sense circuits which can be driven to either one of two binary conditions within a specified time of the occurrence of an input signal.

The output drive capability of many circuits is asymmetrical, or unbalanced, in that the circuit can drive its output to a first level (e.g. ground) much faster than it can drive it to a second level (e.g. $+V_{CC}$). As a result, a problem exists where, for example, significant capacitance is associated with the output of a sense circuit and the time to charge (or discharge) the capacitance to a given level exceeds a specified time limit. It is known to decrease the time needed to charge (or discharge) the capacitance by increasing the current available to charge (or discharge) the capacitance. However, increasing the available current requires that the output impedance of the circuit driving the capacitance be decreased and results in an increase in the power dissipation of the circuit. Also, decreasing the impedance makes it more difficult and more power consumptive to switch the output of the circuit from one state to another.

The problem of driving the output of an unbalanced circuit quickly to either one of two binary states without increasing its drive capability is resolved in circuits embodying the invention by presetting the circuit towards the "slow" state, i.e. the state for which it has the lower drive capability.

Thus, in a circuit which tends to make a transition from a first state to a second state more slowly than from the second state to the first state means are provided for presetting the circuit towards the second state prior to the application of input signals to the circuit. Hence, subsequently, when an input signal is applied tending to set the circuit to the second state the circuit is either in or close to that state, and when an input signal is applied tending to set the circuit to the first state the circuit can quickly go to the first state.

In the accompanying drawing like reference characters denote like components; and FIG. 1 is a schematic diagram of a circuit embodying the invention;

Bipolar transistors and diodes used to illustrate the invention are assumed, for ease of discussion, to have the following characteristics. A Schottky diode is assumed to have a forward voltage drop ($V_{FS}$) of 0.5 volt at room temperature. The forward drop ($V_F$) of a conventional diode (PN junction) and the forward base-to-emitter voltage drop ($V_{BE}$) of the transistors used in the circuit (except for Q1 as noted below) are assumed to be equal to 0.7 volt at room temperature. The collector-to-emitter voltage ($V_{CE\ SAT}$) of a transistor driven into saturation is assumed to be 0.3 volt. Also, for purposes of the present discussion, it is assumed, arbitrarily, that a relatively high voltage level also referred to as "HIGH", represents the binary "1" state and a relatively LOW level also referred to as "LOW" represents the binary "0" state. For the sake of brevity in the explanation which follows, it is sometimes stated that a circuit point is low ("0") or high ("1") rather than stating that a signal representing a low or a high is applied to, or produced by or at, the circuit point.

Figure 1:
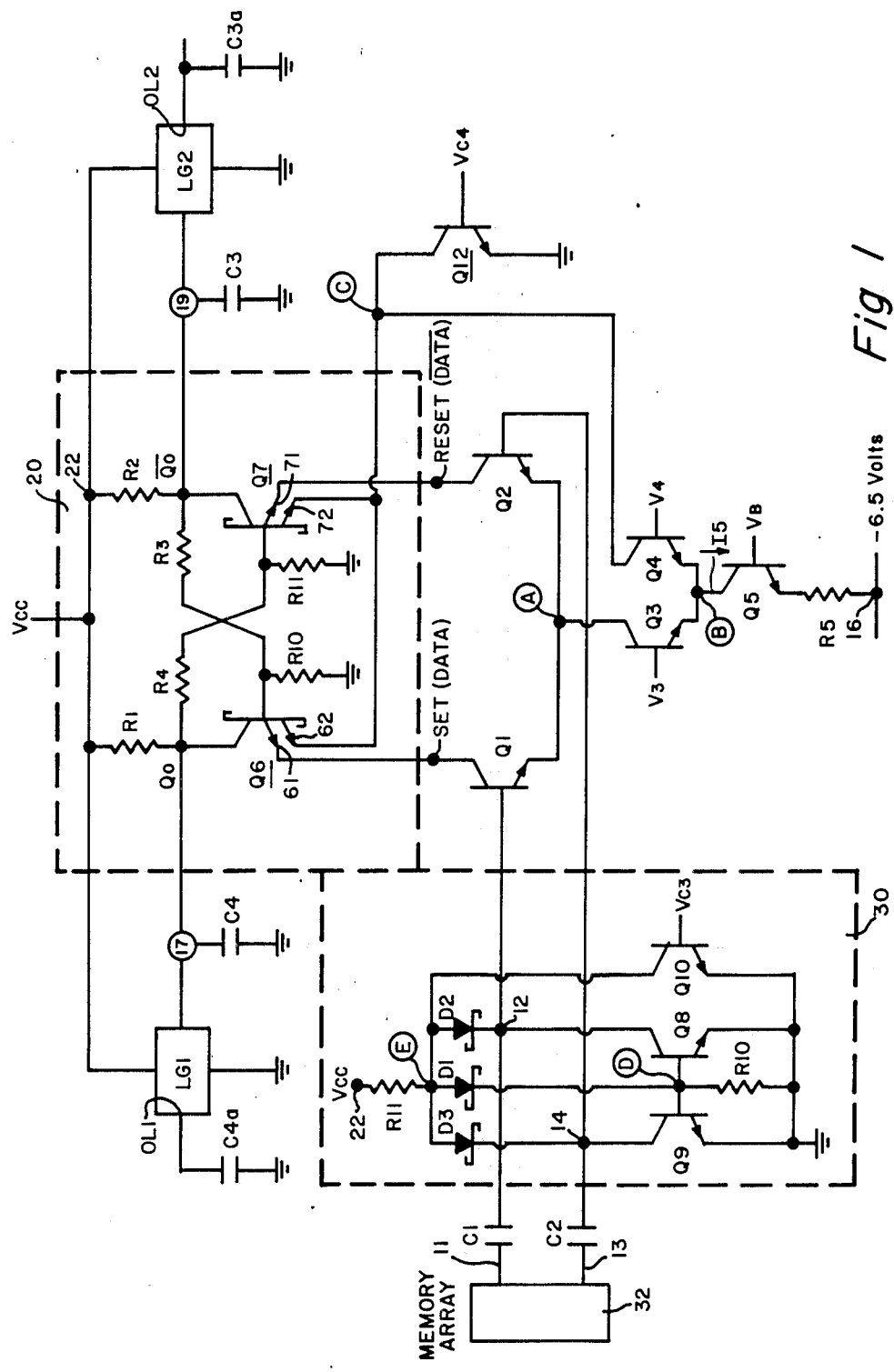

The circuit of FIG. 1 includes a differential amplifier, comprised of NPN transistors Q1 and Q2, which is capacitively coupled to first (11) and second (13) input terminals. For reasons discussed below transistors Q1 and Q2 have different physical dimensions. In this design Q1 is made twice the size of Q2 such that the base-to-emitter voltage ($V_{BE}$) of Q1 is less than the $V_{BE}$ of Q2 for like values of base and emitter currents. For ease of explanation, it is assumed in the discussion to follow that the $V_{BE}$ of Q1 is 0.6 volt and that the $V_{BE}$ of Q2 is 0.7 volt. A capacitor C1 is connected between terminal 11 and the base of Q1, and a capacitor C2 is connected between terminal 13 and the base of Q2. The emitters of Q1 and Q2 are connected at node A to the collector of an NPN transistor Q3. The emitter of NPN transistor Q4 is connected to the emitter of transistor Q3 at a node B. Control signals $V_3$ and $V_4$ are applied to the bases of Q3 and Q4, respectively, whereby Q3 and Q4 function as a differential current switch which is used to selectively supply emitter current to the differential amplifier. When Q3 is turned-on and Q4 is turned-off a current I5 is coupled via the collector-to-emitter path of Q3 to the emitters of Q1 and Q2. When Q3 is turned off and Q4 is turned on the current I5 flows via the collector-to-emitter path of Q4 out of node C. The current I5 is produced by a relatively constant current source means comprised of a transistor Q5 connected at its collector to node B and a resistor R5 connected between the emitter of Q5 and a terminal 16 to which is applied a negative potential of, for example, −6.5 volts. A fixed bias voltage VB is applied to the base of Q5 causing a relatively constant current I5 to flow in the collector of Q5. Depending on the values of V3 and V4 I5 will either flow through Q3 or through Q4. When V3 is more positive than V4 the current I5 can flow via Q3 out of node A, and when V4 is more positive than V3 the current I5 can flow via Q4 out of node C.

The collectors of Q1 and Q2 which define the outputs of the differential amplifier are connected to set (data) and reset ($\overline{\text{data}}$) inputs of a flip-flop 20. Flip-flop 20 includes double-emitter NPN transistors Q6 and Q7 which are cross-coupled by means of resistors R3 and R4. That is, the collector of Q7 is connected to the base of Q6 via resistor R3 and the base of Q7 is connected to the collector of Q6 via resistor R4. The collectors of Q6 and Q7 are then respectively returned via load resistors R1 and R2 to a terminal 22 to which is applied a positive operating potential $V_{CC}$ of, for example, +5 volts. Emitter 61 of Q6, arbitrarily defined as the set input, is connected to the collector of Q1 and emitter 71 of Q7, arbitrarily defined as the reset input, is connected to the collector of Q2. Emitter 62 of Q6 and emitter 72 of Q7 are connected in common to node C.

Node C is selectively clamped to ground potential by means of NPN transistor Q12 whose collector is connected to node C, whose emitter is returned to ground, and to whose base is applied a control signal VC4. When Q12 is turned-on, emitters 62 and 72 are grounded and information previously entered into flip-flop 20 is statically stored.

The collector of Q6, at which is produced the Qo output, is connected to a terminal 17 to which is connected a logic gate, LG1. The collector of Q7, at which is produced the $\overline{Qo}$ output, is connected to an output terminal 19 to which is connected a second logic gate LG2. The bases of Q6 and Q7 are returned to ground via resistors R10 and R11, respectively.

Flip-flop 20 is intrinsically unbalanced in that while its outputs (Qo and $\overline{Qo}$) can be discharged to the low level (i.e. close to ground) very quickly via the collector-to-emitter paths of Q6 or Q7, they are charged up to $V_{CC}$ via load resistors R1 and R2. The values of R1 and R2 cannot be made very small. Otherwise it becomes difficult to switch the flip-flop and its power dissipation becomes excessive. Thus the output capacitance can be discharged to the low level (e.g. ground) much more quickly than it can be charged up to the high level (e.g. $V_{CC}$). Consequently it takes longer for the output to go from the low level to the high level than from the high to the low level. The flip-flop is further unbalanced in that the capacitance associated with one output (e.g. C3 connected between terminal 19 and ground) is much greater than the capacitance associated with the other output (e.g. C4 connected between terminal 17 and ground). Where, for example, C3 is 10 times the size of C4, the time to charge C3 to $V_{CC}$ becomes very large. Using conventional techniques the rise time would exceed circuit specification and, as noted above, the problem cannot be resolved by decreasing the load resistance due to limitation on the switchability of the flip-flop and its permissible power dissipation.

A bias or clamping network 30 is coupled to the bases of Q1 and Q2. Network 30 includes means for establishing and maintaining a bias potential at its outputs which is applied to the bases of Q1 and Q2 prior to the presetting period and after data is sensed and stored. During the presetting period and while data is applied to the sense circuit, the outputs of network 30 appear as a high impedance and it has little, if any, effect on the input signals applied to the bases of Q1 and Q2. Network 30 includes NPN transistors Q8 and Q9 whose collectors are coupled to the bases of Q1 and Q2, respectively, whose emitters are connected to ground, and whose bases are connected to a node D. A ground return resistor R10 is connected between the bases of Q8 and Q9 and their emitters. The anodes of 3 Schottky diodes (D1, D2 and D3) are connected to a node E which is connected via a biasing resistor R11 to node 22 to which is applied $V_{CC}$ volts. The cathode of D1 is connected to node D, the cathode of D2 is connected to node 12 to which are connected the base of Q1 and the collector of Q8, and the cathode of D3 is connected to node 14 to which are connected the base of Q2 and the collector of Q9. Node E is selectively clamped to ground potential by means of NPN transistor Q10 whose collector is connected to node E, whose emitter is returned to ground potential and to whose base is applied a control signal VC3. Diodes D1, D2, D3 are shown to be Schottky diodes but other types of diodes could be used instead.

Figure 2:
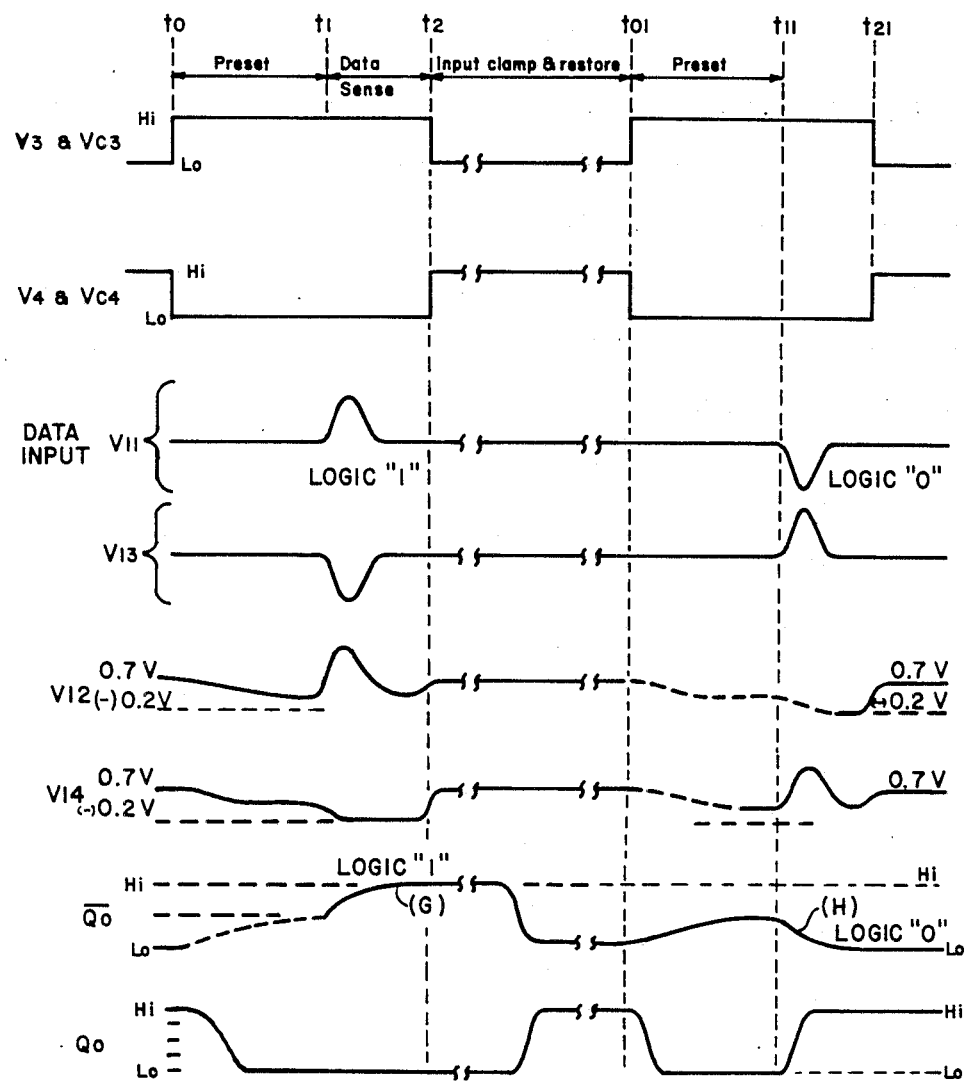
FIG. 2 is a diagram of waveforms, associated with the circuit of FIG. 1.

The circuit of FIG. 1 may be operated in three modes as shown in FIG. 2. The "preset" mode is initiated at a time $t_o$ when control signals $V_3$ and $V_{C3}$ go high and $V_4$ and $V_{C4}$ go low. The data "read" or "sense" mode is initiated at a time $t_1$ when data signals are applied to the circuit. The "restore" or "steady state" mode, which existed prior to time $t_o$, is reestablished at time $t_2$ when $V_3$ and $V_{C3}$ go low and $V_4$ and $V_{C4}$ return to the high level.

Before each data "sense" period the circuit is first "preset", when, as shown at time $t_o$, $V_3$ and $V_{C3}$ go high and $V_4$ and $V_{C4}$ go low. $V_3$-high turns on Q3 and $V_4$-low turns off Q4. The turn-on of Q3 selects and enables the differential amplifier (Q1, Q2) by providing a path for the passage of emitter current (e.g. I5) between node A and terminal 16. Concurrently, $V_{C4}$-low causes Q12 to turn-off. With Q12 turned-off emitters 62 and 72 of Q6 and Q7, respectively, are no longer clamped to ground and the signals applied to emitters 61 and 71 via Q1 and Q2 will determine the state of flip-flop 20. At time $t_o$ the $V_{C3}$-high signal applied to the base of Q10 disables clamping circuit 30. For reasons discussed below it may be assumed that at time $t_o$ the clamping circuit leaves the differential amplifier biased such that the potential ($V_{BQ1}$) at the base of Q1 is equal to the potential ($V_{BQ2}$) at the base of Q2 and that $V_{BQ1} = V_{BQ2} = 0.7$ volt.

Thus, an instant after time $t_o$, the following conditions exist:

(a) a relatively constant current (I5) is supplied to the emitters of Q1 and Q2; (b) the bases of Q1 and Q2 are at nearly the same values of potential (i.e. approximately 0.7 volt); and (c) the $V_{BE}$ (i.e. 0.6 volt) of Q1 is less than the $V_{BE}$ (i.e. 0.7 volt) of Q2.

Although the same potential is applied to the bases of Q1 and Q2, since the $V_{BE}$ of Q1 is less than that of Q2, Q1 conducts more heavily than Q2 and causes a potential to be developed at node A, which tends to turn-off Q2. Thus Q1 turns-on heavily and Q2 is either hardly conducting or turned-off. When Q1 turns-on its collector and the emitter 61 of Q6 are pulled down close to ground potential while the collector of Q2 and the emitter 71 of Q7 can float at some indeterminate level between ground and $V_{CC}$. When the collector of Q1 and the emitter 61 of Q6 are driven close to ground potential, Q6 is turned-on and its collector (Qo) is brought close to ground potential causing Q7 to be turned off. When Q6 is turned-on it discharges C4 and terminal 17 via its collector-to-emitter path close to the "low" level present at its emitter 61. When Q7 is turned-off its collector ($\overline{Qo}$) is driven towards $V_{CC}$ via R2. This provides additional base drive to Q6 ensuring its continued turn-on and the eventual clamping of the collector (Qo) of Q6 to the low level. Concurrently R2 continues to charge capacitor C3 towards $V_{CC}$ ensuring the rise of $\overline{Qo}$ and the voltage at node 19 towards $V_{CC}$. At the termination of the preset period, at time $t_1$, as shown for waveform $\overline{Qo}$ in FIG. 2, the flip-flop is preset such that $\overline{Qo}$ and the large capacitance C3 associated with terminal 19 are charged to a point which is somewhere between the "high" (i.e. $V_{CC}$) and the "low" (i.e. ground) levels. Concurrently, the Qo output which can respond quickly is discharged to the "low" level.

A data "read" or "sense" period is initiated at a time $t_1$, as shown in FIG. 2, when data input signals are applied to terminals 11 and 13 from memory array 32. If a logic "1" is present, the data input signals consist of a positive pulse on 11 and a negative pulse on 13. If a logic "0" is present the data input signals consist of a negative pulse on 11 and a positive pulse on 13. The amplitude of the pulses is typically greater than 1 volt.

It may be assumed that during the interval from $t_o$ to $t_1$, the potentials at the bases of Q1 and Q2 may decay in a negative direction from the 0.7 volt level. But, as explained below, the bias network 30 prevents the bias from going more negative than $-0.2$ volt. Hence, if, at time $t_1$, a positive pulse of more than 1 volt amplitude is applied to terminal 11 and a negative pulse is applied to terminal 13, Q1 which is already turned-on remains ON, and Q2 which is already hardly conducting or turned-off is turned-off fully. If Q1 was not fully turned-on prior to $t_1$ it is now (at time $t_1$) driven to the full ON condition and if Q2 was not fully turned-off it is now driven to the full off condition. Q6 is then either fully turned-on or driven to the full-ON condition and Q7 is either fully turned-off or driven to the full-OFF condition. Thus, when a logic "1" signal is applied to the circuit, the circuit continues to go to the condition initiated when the circuit was preset, as shown for section G of waveform $\overline{Qo}$ in FIG. 2. The time needed for the circuit to reach the steady state "1" condition is then well within specified limits. Measuring from the point in time $(t_1)$ when data is applied to the circuit it is evident that $\overline{Qo}$ goes high ($\approx V_{CC}$) in much less time than would be needed if presetting were not employed.

If a positive pulse is applied to terminal 13 and a negative pulse is applied to terminal 11, as shown at time $t_{11}$, Q1 is turned-off and Q2 is turned-on. The turn-on of Q2 causes emitter 71 of Q7 to be driven low and Q7 to turn-on discharging $\overline{Qo}$ (terminal 19 and C3) towards ground potential very quickly via the collector-to-emitter path of Q7. Thus although $\overline{Qo}$ and C3 were charged towards $V_{CC}$ they can be quickly discharged to the low level as shown in section H of waveform $\overline{Qo}$ of FIG. 2. Lowering the potential at the collector of Q7 decreases the potential applied to the base of Q6. Since Q1 is already turned-off and emitters 62 and 72 are floating, Q6 is quickly turned-off and its collector is easily and quickly charged toward $V_{CC}$ via R1. Where, as noted above, the capacitance C4 associated with terminal 17 is one-tenth the capacitance C3 associated with terminal 19, the time to charge output 17 to the "high" level is always well within desired limits. Thus when a logic "0" is applied to the circuit, the "preset" conditioning of the flip-flop to the "1" state has to be reversed. But, since the "0" state is the state for which the circuit reacts quickly that condition is reached well within the time specified as shown in FIG. 2.

It should be appreciated that the forward current gain ($\beta$) of Q1 and Q2 are very similar. Thus the differential amplifier comprised of Q1 and Q2 functions to control the presetting of the flip-flop without adversely affecting the setting of the flip-flop when data signals are subsequently applied. As discussed above, during the preset portion of the sense cycle a current I5 is coupled to flip flop 20 via the collector-to-emitter path of the differential amplifier transistor (e.g. Q1) which was made larger than the other. However, when data is applied to the sense circuit, it is the one of the two differential amplifier transistors whose base is driven more positive which controls. During "preset", transistors Q1 and Q2 are operated in the common mode. During the data sensing portion of the cycle, the transistor whose base is driven more positive is operated in the common emitter mode and the other is turned-off. Operating the differential amplifier in these two modes enables the differential amplifier to be used effectively for both presetting and data sensing.

The response of the Q1 and Q2 differential stage is fast due in part to the fact that Q1 and Q2 are prevented from saturating during preset.

For ease of discussion, it was assumed above that the capacitance at node 19 was significantly greater than the capacitance at node 17. In fact, the capacitance at nodes 17 and 19 may be nearly equal. However, a similar problem to the one discussed above is present and a similar solution is instituted where the capacitance (e.g. C3a in FIG. 1) at the output of one of the logic gates (e.g. LG2) is much larger than the capacitance (e.g. C4a) at the output of the other logic gate (e.g. LG1).

Figure 3:
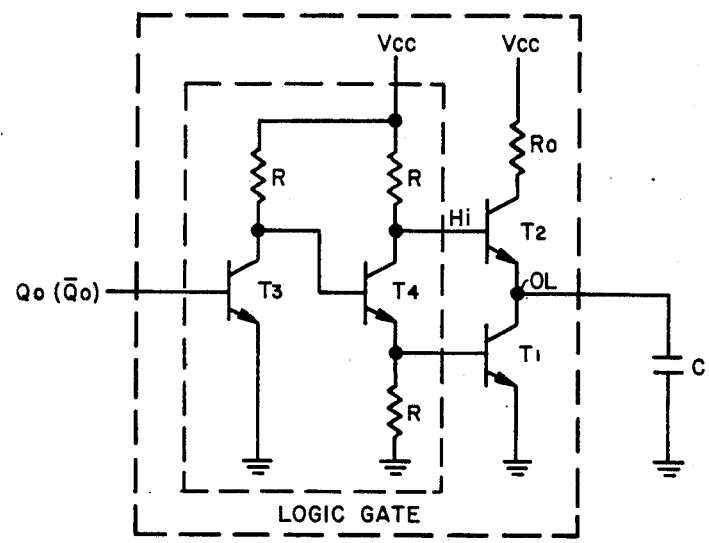
FIGS. 3 and 4 are schematic diagrams of buffer circuits which may be used with circuits embodying the invention.

For example, LG1 and LG2 may be non-inverting buffers of the type shown in FIG. 3 connected at their inputs to output terminals 17 and 19, respectively, and connected at their outputs, OL1 and OL2, to capacitance C4a and C3a, respectively. As shown in FIG. 3 the output of each logic gate (LG1, LG2) includes a resistance (RO) connected in series with a transistor $T_2$ between $V_{CC}$ and its output (OL) and a clamping transistor (T1) connected between its output and ground. Assuming, as before, that C3a is larger than C4a, the output OL2 of LG2 would be precharged towards $V_{CC}$ during the preset portion of a read cycle. Then, depending on whether a "1" or a "0" data input were applied to the differential amplifier the output at OL2 would continue towards $V_{CC}$ as shown in waveform G (for a logic "1") or else the output would be driven to ground as shown in waveform H (for a logic "0").

Figure 4:
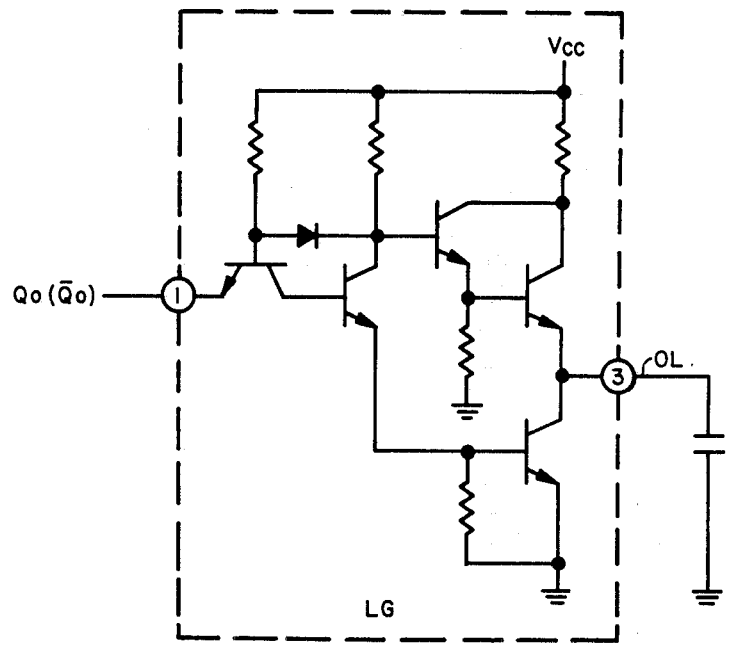

Logic gates LG1 and LG2 may be inverting gates of the type shown in FIG. 4 rather than non-inverting buffers shown in FIG. 3. For such a circuit configuration, and assuming C3a to be larger than C4, Q2 would be made larger than Q1 to make the $V_{BE}$ of Q2 smaller than that of Q1 to cause OL2 to be driven towards $V_{CC}$ during preset. Of course, if C4a were greater than C3a, Q1 would be made greater than Q2 to cause OL1 to be charged towards $V_{CC}$ during preset.

In the circuit of FIG. 1, the differential amplifier transistors (Q1, Q2) were shown to be bipolar transistors. However other types of transistors such as insulated-gate field-effect transistors (IGFETs) could be used instead.

The differential amplifier is biased and set up by means of network 30 of FIG. 1 which has two operating modes. Network 30 is "enabled" and functions to hold the bases of Q1 and Q2 at approximately 0.7 volt prior to the application of a preset signal (i.e. during restore). The clamp network is "disabled" and releases the bases of Q1 and Q2 which can then be driven by, and respond to, input signals applied to terminals 11 and 13 during the "preset" and "sense" periods.

During "Restore" and prior to the preset period (i.e. before time $t_o$) the control signal VC3 is low and transistor Q10 is turned off. A current I1 then flows from $V_{CC}$ via R11 into node E. Part of this current then flows via diode D1 into the bases of Q8 and Q9 forward biasing these two transistors. A current which is Beta (the forward current gain) times the current into the base of Q8 then flows from node E via diode D2 and the collector-to-emitter path of Q8 to ground. A like current also flows from node E via diode D3 and the collector-to-emitter path of Q9 to ground. Since D2 and D3 are made similar and since Q8 and Q9 are similar, the base and collector currents though Q8 and Q9 will be very nearly identical. Q8 and Q9 are forward biased and may be turned-on hard. However, Q8 and Q9 are prevented from going into saturation and the voltages at their collectors is held at $V_{BE}$ volts (approximately 0.7 volt), as demonstrated by the following analysis. There are three parallel paths between node E and ground. Namely: (1) diode D1 in series with the base-to-emitter junctions of Q8 or Q9; (2) diode D2 in series with the collector-to-emitter of Q8; and (3) diode D3 in series with the collector to emitter of Q9. Assuming the forward voltage drops of diodes D1, D2 and D3 to be approximately equal it follows that the collector-to-emitter voltage ($V_{CE}$) of Q8 or Q9 must be approximately equal to the base-to-emitter voltage of Q8 or Q9.

The potential ($V_E$) at node E is equal to the $V_{BE}$ of Q8 or Q9 plus the forward voltage drop ($V_{FS}$) of diode D1. When Q8 and Q9 are turned-on, the voltage at their collectors is equal to $V_E$ less the forward drop ($V_{FS}$) of D2 or D3. Since $V_E$ is equal to $V_{BE}$ plus $V_{FS}$ and since the $V_{FS}$ of diodes D1, D2 and D3 are assumed equal, then the voltage ($V_C$) at the collectors of Q8 and Q9 is approximately equal to $V_{BE}$ volts.

The voltage ($V_C$) at the collectors of Q8 and Q9 is regulated by means of feedback via the collector diodes D2 and D3. For example, if the $V_C$ of Q8 drops below $V_{BE}$ then the voltage ($V_E$) at node E drops below $V_{BE}$ plus $V_{FS}$. When that happens, the voltage ($V_D$) at node D which is equal to $V_E - V_{FS}$ drops below $V_{BE}$. Decreasing $V_D$ below $V_{BE}$ causes a decrease in the base current to Q8 which results in a decrease in the collector current through Q8. Decreasing the collector current of Q8 causes less current to flow through R11. A drop in current through R11 causes the potential at nodes E and D and at the collector of Q8 to increase back towards its original value. $V_C$ of Q8 which is equal to the $V_B$ of Q1 is thus regulated and maintained at $V_{BE}$ volts. The $V_C$ of Q9 and the $V_B$ of Q2 is similarly controlled. Thus network 30 provides a regulated bias voltage at its outputs (i.e. the collectors of Q8 and Q9). This bias voltage can then be used to reliably bias the inputs of a differential amplifier stage.

Q8 and Q9 are operated in the linear region whereby the potentials at their collectors and at the bases of Q1 and Q2 are regulated and can be maintained at approximately the same levels. Maintaining the potential at the bases of Q1 and Q2 nearly equal is important since a differential in excess of 100 millivolts might cause an erroneous switching of the differential amplifier transistors.

Developing and applying a potential of $V_{BE}$ volts to the bases of transistors Q1 and Q2 ensures that Q1 and Q2 are biased on the verge of conduction during preset. Thus transistors Q1 and Q2 are biased at a point which enables them to respond very quickly in response to a data input signals at time $t_1$.

Since Q8 and Q9 are operated in the linear region (i.e. they are kept out of saturation) they can be turned-off very quickly when at time $t_o$ $V_{C3}$-high turns-on Q10 and clamps node E to the $V_{CE\ SAT}$ of Q10.

In network 30 the bases and collectors of Q8 and Q9 are coupled via diodes to a common point and the base and collector currents of Q8 and Q9 flow through a common resistor R11 to provide voltage regulation using very few components interconnected in a very simple manner.

The operation of the clamping network during the "preset" and data "sense" periods is as follows. At time $t_o$, transistor Q10 is turned-on. This clamps node E to the $V_{CE\ SAT}$ of Q10 (assumed to be approximately 0.3 volt) and turns-off Q8 and Q9, disabling network 30. When Q8 and Q9 are first turned-off, the potentials on the plates of C1 and C2 connected to the bases of Q1 and Q2 will be at, or close to, 0.7 volt. Since Q8 and Q9 are turned-off they now appear as extremely high impedances connected to the bases of Q1 and Q2 and have negligble effect on the operation of the circuit. The potential at the bases of Q1 and Q2 (nodes 12 and 14, respectively) does not change very much during the preset period. Since Q8 and Q9 are turned off and present a high impedance, only the relatively small currents flowing into the bases of Q1 and Q2 cause the voltage at nodes 12 and 14 to discharge towards a negative level. The base currents into Q1 and Q2 are, approximately, 1/Beta the value of their emitter current. Thus where I5 is in the order of 1 millampere and Beta is in the order of 100 the base currents into each one of Q1 and Q2 is less than 0.01 milliamperes. Assuming C1 and C2 to be approximately 50 picofarads and the preset interval to be 100 nanoseconds, the voltage at nodes 12 and 14 would discharge by a few hundredths of a volt. Thus, in the absence of noise signals coupled to the input terminals (11, 13 and 12, 14), the bases of Q1 and Q2 would remain close to the bias value of 0.7 volt during preset.

However, noise signals may be coupled to the input terminals during preset tending to cause the bases of Q1 and Q2 to go positive or negative. [It is assumed that noise signals would appear with essentially the same amplitude at the input terminals]. As long as the noise signals drive both inputs positive by the same amount the circuit will respond correctly to the differential data input signals (so long as the two input transistors (Q1, Q2) are not driven deep into saturation). However if the noise signals were capable of driving both inputs to a highly negative level, then, the differential data input signals might not be able to switch the differential amplifier in response to the data input signals.

This problem is solved in network 30 by allowing nodes 12 and 14 to go to a relatively large positive voltage during the restore period while preventing the voltages at these nodes from going much below $-0.2$ volt as discussed below.

When node E is clamped via Q10, the minimum voltage ($V_E$) at node E is equal to the $V_{CE\ SAT}$ of Q10, which is assumed to be equal to 0.3 volt. Recall from above that the $V_{FS}$ of diodes D1, D2, and D3 is 0.5 volt. Hence, whenever the voltage at one of nodes 12, 14, or D drops below $-0.2$ volt, the diode connected to that node will conduct in the forward direction tending to clamp that node at $-0.2$ volt. Hence any negative going data signal applied to input terminals 11 and 13 and which is then A.C. coupled to the bases of Q1 and Q2 cannot cause the potential at nodes 12 and 14 to go much more negative than $-0.2$ volt. Thus, diodes D2 and D3 clamp the voltages at nodes 12 and 14 to approximately $-0.2$ volt as illustrated in waveforms V12 and V14 of FIG. 2.

On the other hand, any positive data signal applied to input terminals 11 or 13 which is A.C. coupled to the bases of Q1 or Q2 is superimposed on the existing base bias potential. These signals can go more positive than $-0.2$ volt, as shown in FIG. 2, without interference from network 30 since any potential at nodes 12 or 14 more positive than $-0.2$ volt tends to reverse bias diodes D2 and D3. [Of course, it is assumed that the positive signals do not exceed the reverse breakdown of the diodes or the breakdown of the transistor junctions.]

At the end of the sense period (e.g., at time t2) network 30 is again enabled when Q10 is turned-off. Clamp/bias circuit 30 then quickly restores the potential at nodes 12 and 14 to the bias voltage of approximately 0.7 volt erasing any residual imbalance at node 12 and 14 remaining from the previous data input signals.

What is claimed is:

1. The combination comprising:
    a flip-flop having set and reset inputs and first and second complementary outputs, said flip-flop being characterized in that its outputs are driven from a first state to a second state more slowly than from the second state to the first state and said flip-flop being further characterized in that there is significantly more capacitance associated with one output than with the other; and a selectively enabled differential amplifier having first and second inputs coupled to receive binary input signals, and having a first output connected to said set input and a second output connected to said reset input; said differential amplifier, when enabled and in the absence of input signals, including means for driving said one output of said flip-flop towards said second state when the voltages applied to its first and second inputs are approximately equal.

2. The combination as claimed in claim 1 wherein said selectively enabled differential amplifier includes first and second transistors, each transistor having a base, an emitter and a collector, and wherein the base-to-emitter voltage of one of said first and second transistors is less than that of the other for equal base and emitter currents;

wherein the base of one of said transistors is connected to and defines said first input of said differential amplifier, and wherein the base of the other one of said transistors is connected to and defines said second input of said differential amplifier;

wherein the collector of one of said transistors is connected to said set input of said flip-flop and the collector of the other one of said transistors is connected to said reset input of said flip-flop; and wherein the emitters of said transistors are connected to a common node.

3. The combination as claimed in claim 2 wherein said one of said first and second transistors is made larger than the other whereby its base-to-emitter voltage is less than that of the other transistor.

4. The combination as claimed in claim 1 wherein said selectively enabled differential amplifier includes first and second transistors, each one of said first and second transistors having first and second electrodes defining the ends of a conduction path and a control electrode for controlling the conductivity of its conduction path, and each one of said first and second transistors being characterized in that the potential at its control electrode with respect to its first electrode must exceed a given threshold value for conductivity to occur, and wherein the threshold value of one of said first and second transistors is made higher than that of the other whereby, when equal voltages are applied to the control electrodes of said first and second transistors and their first electrodes are connected in common to a current source, the transistor with the lower threshold conducts significantly more than the other transistor;

wherein the control electrode of said first transistor is connected to said first input of said differential amplifier and the control electrode of said second transistor is connected to said second input of said differential amplifier;

wherein the second electrode of said first transistor is connected to said set input of said flip-flop and said second electrode of said second transistor is connected to said reset input of said flip-flop; and wherein the first electrode of said first and second transistors are connected to a common node to which is selectively applied a current source.

5. The combination as claimed in claim 1, further including a first buffer gate connected at its input to said first output of said flip-flop and a second buffer gate connected at its input to said second output of said flip-flop.

6. In a circuit having an output and which includes a storage means which in response to an input signal of one binary significance drives said output to a first state and which in response to an input signal of the other binary significance drives said output to a second state and where the output drive of the circuit is asymmetrical whereby the transition from the first state to a second state tends to be slower than the transition from the second state to the first state, the improvement comprising:

differential amplifying means coupled to said storage means for presetting the circuit towards the second state prior to the application of said input signals to the circuit.

7. In the circuit as claimed in claim 6 wherein said storage means includes set and reset inputs and first and second complementary outputs, and wherein said differential amplifying presetting means includes first and second differentially connected transistors, each one of said first and second transistors having a base, a collector and an emitter; wherein the collector of said first transistor is connected to said set input and the collector of the second transistor to said reset input; and wherein a bias voltage of approximately equal value is applied to the bases of said first and second transistors during a presetting period prior to the application of said input signal;

wherein means are provided for selectively coupling a source of current to the emitters of said first and second transistors; and wherein one of said first and second transistors is made to conduct a higher current than the other for equal values of forward biasing base-to-emitter voltage.

8. In the circuit as claimed in claim 6 wherein said storage means includes set and reset inputs and first and second complementary outputs; and wherein said circuit includes first and second buffer means each buffer means having an input and an output, the first buffer means being connected at its input to one output of said storage means and the second buffer means being connected at its input to the other output of said storage means;

wherein capacitance associated with the output of said first buffer means is significantly greater than the capacitance associated with the output of said second buffer means;

wherein the output drive of the first buffer means is asymmetrical causing the transition at its output to go from said first state to said second state more slowly than from said second state to said first state; and wherein said differential amplifying presetting means includes means for driving said storage means to the state which tends to place the output of the first buffer means in said second state.

* * * * *